United States Patent
Yarmolich

(10) Patent No.: US 10,047,432 B2
(45) Date of Patent: Aug. 14, 2018

(54) VIRTUAL CATHODE DEPOSITION (VCD) FOR THIN FILM MANUFACTURING

(71) Applicant: PLASMA APP LTD., Oxford (GB)

(72) Inventor: Dmitry Yarmolich, London (GB)

(73) Assignee: PLASMA APP LTD., Oxford (GB)

( * ) Notice: Subject to any disclaimer, the term of this patent is extended or adjusted under 35 U.S.C. 154(b) by 0 days.

(21) Appl. No.: 15/512,315

(22) PCT Filed: Sep. 18, 2015

(86) PCT No.: PCT/IB2015/057205
§ 371 (c)(1),
(2) Date: Mar. 17, 2017

(87) PCT Pub. No.: WO2016/042530
PCT Pub. Date: Mar. 24, 2016

(65) Prior Publication Data
US 2017/0247789 A1    Aug. 31, 2017

(30) Foreign Application Priority Data
Sep. 18, 2014   (GB) ................................. 1416497.4

(51) Int. Cl.
*H05H 1/24*    (2006.01)
*C23C 14/30*   (2006.01)
(Continued)

(52) U.S. Cl.
CPC .......... *C23C 14/30* (2013.01); *H01J 37/3233* (2013.01); *H01J 37/32449* (2013.01);
(Continued)

(58) Field of Classification Search
CPC ...... C23C 14/30; C23C 14/24; H01J 37/3233; H01J 37/32449; H01J 37/32569
See application file for complete search history.

(56) References Cited

U.S. PATENT DOCUMENTS

| 4,039,416 A | 8/1977 | White |
| 2011/0188622 A1 | 8/2011 | Shrier |
| 2015/0136583 A1* | 5/2015 | Skocdopolova ...... H01J 37/077 204/192.1 |

FOREIGN PATENT DOCUMENTS

| WO | WO/2010/109297 A2 | 9/2010 |
| WO | WO/2012/025947 A1 | 3/2012 |

(Continued)

OTHER PUBLICATIONS

The ISR/WO as issued in PCT/IB2015/057205 dated Jan. 22, 2016.
(Continued)

*Primary Examiner* — Kelly M Gambetta
(74) *Attorney, Agent, or Firm* — Symbus Law Group, LLC; Clifford D. Hyra

(57) ABSTRACT

A virtual cathode deposition apparatus utilises virtual plasma cathode for generation of high density electron beam to ablate a solid target. A high voltage electrical pulse ionizes gas to produce a plasma which temporarily appears in front of the target and serves as the virtual plasma cathode at the vicinity of target. This plasma then disappears allowing the ablated target material in a form of a plasma plume to propagate toward the substrate. Several virtual cathodes operating in parallel provide plumes that merge into a uniform plasma which when condensing on a nearby substrate leads to wide area deposition of a uniform thickness thin film.

36 Claims, 5 Drawing Sheets

(51) Int. Cl.
*H01J 37/32* (2006.01)
*H01J 37/34* (2006.01)

(52) U.S. Cl.
CPC .. *H01J 37/32596* (2013.01); *H01J 37/32816* (2013.01); *H01J 37/3467* (2013.01); *H01J 2237/332* (2013.01)

(56) References Cited

FOREIGN PATENT DOCUMENTS

| WO | WO 2014/097262 A1 | 6/2014 | | |
|----|---|---|---|---|
| WO | WO/2014/097626 A1 | 6/2014 | | |
| WO | WO 2014097262 A1 | * | 6/2014 | ............. H01J 3/025 |

OTHER PUBLICATIONS

A combined Search and Examination report as issued in GB1416497.4 dated Mar. 20, 2015.
International Preliminary Report on Patentability dated Mar. 21, 2017.

* cited by examiner

VIRTUAL CATHODE DEPOSITION (VCD) FOR THIN FILM MANUFACTURING

FIELD OF INVENTION

The present invention concerns a device for deposition of thin films on substrates.

BACKGROUND OF THE INVENTION

Fabrication of a film on a substrate generally requires a stream of molecules, atoms, or ions directed toward the substrate. This stream condenses to form a solid state film on the appropriate substrate surface, generally such deposition methods are termed as Physical Vapor Deposition (PVD). Examples include Pulsed Laser Deposition (PLD) and Pulsed Electron Deposition (PED). The extremely high energy density pulse of from the laser or electron beam can ablate the target (turn some amount of solid target into plasma). This plasma expands outward towards the target in the form of a plasma plume with a composition comprising the target compounds.

To enable PED an electron beam source is required providing an electron beam energy density of $\geq 10^8$ W/cm$^2$ at the target surface. Known apparatuses and methods to produce such electron beams (U.S. Pat. No. 7,557,511 or WO2011IT00301) are based on channel-spark discharge (CSD) introduced in U.S. Pat. No. 5,576,593 by C. Schultheiss. The CSD apparatus comprises a hollow cathode plasma source, with an activation group to trigger the plasma generation, and a dielectric tubular element. The tubular element guides the flux of electrons extracted from the hollow cathode plasma towards the target which serves as an anode. Under optimal conditions, which are strongly dependent on the pressure in a process chamber, as described in U.S. Pat. No. 7,557,511, it is possible to generate well-collimated beam directed by the tube, which emerges from its exit, and is able to propagate beyond the tube due to the beam-induced space charge neutralization.

The PED technique has been used to manufacture different types of films comprising metals, semiconductors, and dielectric materials coatings having superior quality. In spite of successful deposition experiments in a number of worldwide laboratories, there is as yet no successful industrial application of the pulsed electron beam for deposition of thin films. The main reason that the electron beam source based on CSD has failed for industrial applications is because of the short life-time (generally <10$^8$ shots) of the dielectric tubular element, low reproducibility of the pulses from-shot-to-shot, and scalability problems for wide area deposition.

DISCLOSURE OF INVENTION

A new type of thin film deposition apparatus and method are proposed. The deposition apparatus operation is based on application high voltage (1-60 kV) high current (0.1-10 kA) electrical pulse, generated by a pulsed power group, to a virtual cathode group. The virtual cathode group apparatus generates initial plasma from a gas supplied in a gas container. This initial plasma, being injected in front of target, forms a virtual plasma cathode. This virtual cathode plasma obtains a negative potential bias, provided by the pulsed power supply, that leads to generation of an electron beam. The formation of the electron beam occurs in the thin sheath which is formed between the boundary of the plasma serving as virtual cathode and the target serving as an anode. Due to the small distance between the plasma boundary and target the space-charge limit is high and this allows high-energy and high-current pulsed electron beam generation, sufficient for the solid target ablation.

The virtual plasma cathode appears temporarily in front of the target, ablates it with electron beam, and then disappears allowing the ablated material of target to propagate towards the substrate, where it condenses to form a thin film. The ablated material, in a form of a plasma plume, propagates outward the target surface through the section where the virtual cathode plasma was located. In this way, the factor restricting the uptime of electron beam sources—contamination of the cathode by the ablated material—is avoided because the cathode is a virtual one, formed from plasma and it cannot become contaminated in the way that a conventional solid material cathode can.

According to a first aspect of the invention there is provided a thin film deposition apparatus comprising a hollow cathode, a substrate holder and a target holder, the substrate holder and the target holder being located on opposite sides of the hollow cathode, a plasma supply element to supply plasma to the interior of the hollow cathode at an end of the hollow cathode nearest the target holder, and a power unit connected to the hollow cathode to supply a high voltage pulse to the hollow cathode, such that when the plasma supply element supplies plasma to the hollow cathode and a high voltage pulse is applied to the hollow cathode, a virtual plasma cathode forms, and such that the virtual plasma cathode generates an electron beam, directed towards a target held in the target holder, and wherein a plume of ablated target material passes through the hollow cathode.

The plasma supply element may comprise a hollow cap electrode adjacent the hollow cathode and defining a gas container.

The hollow cap electrode may be spaced from the hollow cathode by an insulating ring and a gas flow slit extends from the gas container to the interior of the hollow cathode.

The gas flow slit may have a width in the range 0.1 mm to 10 mm.

The thin film deposition apparatus may comprise an electrical trigger unit connected to the hollow cap electrode to generate an initial plasma within the hollow cap electrode.

The electrical trigger unit may be operable to generate an electrical pulse with a voltage in the range 1 kV to 60 kV.

The electrical trigger unit may be operable to generate an electrical pulse with a current in the range 0.01 kA to 1 kA.

The electrical trigger unit may be operable to generate an electrical pulse with a duration of <1 µs.

The thin film deposition apparatus may comprise a gas conduit to supply gas to the gas container.

The gas conduit may be conductive and connect the trigger unit to the hollow cathode.

The hollow cathode may be substantially cylindrical.

The hollow cathode may have a longitudinal axis, wherein the longitudinal axis is substantially normal to a surface of a target held in the target holder and to a surface of a substrate held in the substrate holder.

The diameter of the hollow cathode may be in the range 0.1 mm to 100 mm.

The diameter of the hollow cathode may be in the range 2 to 40 mm.

The diameter of the hollow cathode may be in the range 0.1 mm to 2 mm.

The hollow cathode may have a diameter to length ratio in the range 0.1 to 10.

The ratio of the distance between a surface of a target held in the target holder and the hollow cathode to the diameter of the hollow cathode may be in the range 0.1 to 10, and preferably may be about 1.

The power unit may be operable to generate an electrical pulse with a voltage in the range −1 kV to −60 kV and preferably in the range −5 kV to −20 kV.

The power unit may be operable to generate an electrical pulse with a current in the range 0.1 kA to 10 kA to provide the energy for ablation of the target.

The power unit may be operable to generate an electrical pulse with aduration in the range 0.1 μs to 100 μs.

The thin film deposition apparatus may comprise a process chamber containing the hollow cathode, substrate holder, target holder, and plasma supply element, and a pump element to maintain the pressure within the process chamber.

The pressure within the process chamber may be maintained in the range $10^{-5}$ mbar to 100 mbar.

The thin film deposition apparatus may comprise a plurality of hollow cathodes.

The thin film deposition apparatus may further comprise an auxiliary gas container, the gas container being connected to the gas container by a plurality of apertures.

The thin film deposition apparatus may further comprise an auxiliary trigger electrode located in the gas container.

The thin film deposition apparatus may further comprise an auxiliary trigger electrical trigger unit connected to the auxiliary trigger electrode.

According to a second aspect of the invention there is provided a method of thin film deposition comprising providing a hollow cathode, a substrate and a target, the substrate and the target being located on opposite sides of the hollow cathode, supplying plasma to the interior of the hollow cathode at an end of the hollow cathode nearest the target, and supplying a high voltage pulse to the hollow cathode, such that an electron beam is generated directed towards a target held in the target holder, and wherein a plume of ablated target material passes through the hollow cathode towards the substrate.

The method may comprise supplying gas to a hollow cap electrode adjacent the hollow cathode and defining a gas container, and supplying an electrical trigger pulse to the hollow cap electrode to generate plasma within the hollow cap electrode.

The electrical trigger pulse may have a voltage in the range 1 kV to 60 kV and a current in the range 0.01 kA to 1 kA.

The electrical trigger pulse may have a duration of <1 μs.

The method may comprise locating the target such that the ratio of the distance between a surface of the target and the hollow cathode to the diameter of the hollow cathode is in the range 0.1 to 10, and preferably is about 1.

The high voltage pulse may have a voltage up to −60 kV and current of 0.1-10 kA.

The high voltage pulse may have a duration in the range 0.1 μs to 100 μs.

According to a third aspect of the invention there is provided a method according to the second aspect of the invention where carried out using an apparatus according to the first aspect of the invention.

BRIEF DESCRIPTION OF DRAWINGS

For a more complete explanation of the present invention and the technical advantages thereof, reference is now made to the following description and the accompanying drawings in which.

BEST MODE FOR CARRYING OUT THE INVENTION

Figure 1:
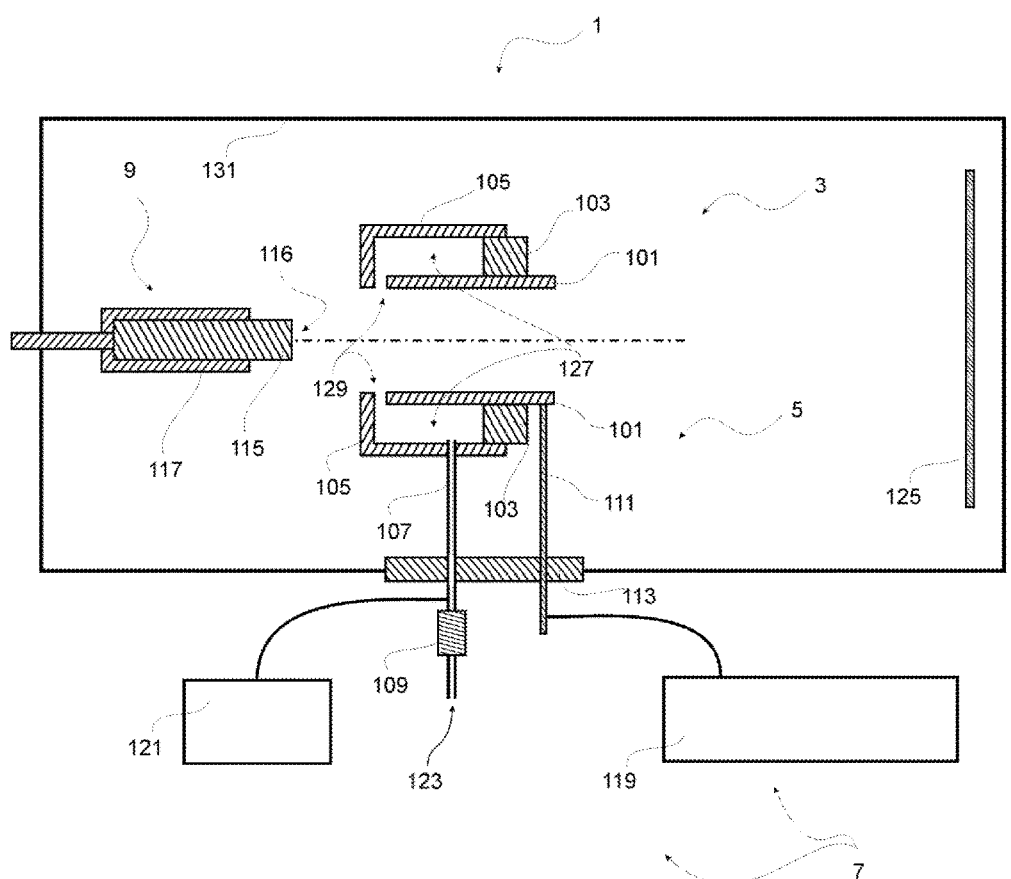
FIG. 1 shows cross-sectional view of a virtual cathode apparatus embodying the present invention.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

A virtual cathode deposition (VCD) apparatus, prior to the plasma activation, is shown in FIG. 1. The VCD apparatus is wholly indicated with reference numeral 1 in FIG. 1.

The device 1 according to the present invention comprises a process chamber 131. The process chamber 131 is provided by a constant pumping (not shown in FIG. 1) of the gases to provide the pressure in the range of $10^{-5}$-100 mbar inside the process chamber. Obviously, the process chamber 131 is built in such a way that it is vacuum-tight with regards to the external environment. The device 1 further comprises a Virtual Cathode group, wholly indicated with reference numeral 3.

The device 1 further comprises a feeding and supporting group, wholly indicated with reference numeral 5.

The device 1 further comprises a pulsed power group, wholly indicated with reference numeral 7.

The device 1 further comprises a target group, wholly indicated with reference numeral 9.

The target group 9 further comprises a target 115 which is hold in a suitable target holder 117. The target material comprises chemical elements that have to be deposited in a form the thin film on a substrate surface 125.

The substrate 125 is also kept in the process chamber 131 and may be constituted by a part or a component of electric or electronic devices like solar cells, organic transistors, displays, light sources, and the like, or even by a mechanical part or component, with no limitations.

The target holder 117 is at least partially contained in the chamber 131 and comprised of any known material having electrical conductivity $>1·10^3$ S/m and melting temperature >300° C. preferably stainless steel, tungsten, copper, bronze or other metal alloy. The target holder 117 provides the electrical connection of the process chamber 131 and the target 115. The electrical potential of the chamber 131, target 115, and target holder 117 have to be as close as possible to a zero value (ground potential) during the apparatus operation. This may require a minimal electrical inductance of the target holder 117 and the tight electrical contact between chamber, target holder, and target.

The target 115 can have the shape of a rod, cylinder, pellet, parallelepiped, or any other with no limitations characterized in that it provides at least 1 mm² of its surface at an axis of symmetry of the Virtual Cathode group 3. This is target ablation area, designated as 116 in FIG. 1, has normal orientation of surface with respect to the axis of symmetry of the Virtual Cathode group 3 and it should preferably not change its position or orientation during rotation, or any other of target movement provided by the target holder 117 in a per se any known way.

The Virtual Cathode group 3 is suitable to generate plasma in the target 115 vicinity. The plasma serves as virtual cathode to generate an electron beam to ablate the target surface, as better described hereafter. The virtual cathode plasma is formed from the initial plasma which provided by initial plasma supply assembly. In a preferred embodiment of the present invention, the Virtual Cathode group 3 is wholly contained in the chamber 131. The Virtual Cathode group 3 comprises a hollow cathode 101, an insulator ring 103, and a hollow cap electrode 105.

The hollow cathode made of any known material having electrical conductivity >1·10³ S/m and melting temperature >300° C. preferably stainless steel, tungsten, copper, bronze or other metal alloy. The hollow cathode has shape of a hollow cylinder having a diameter to length ratio in the range of 0.1-10, with thickness of wall >0.05 mm. The diameter of the hollow cathode 101 is on the range of 0.1-100 mm depending on the pressure of the gas in the process chamber. In more particular, for the pressure of 1·10⁻⁴ mbar (1·10⁻² Pa) the diameter is in the range of 2-60 mm, and for a 100 mbar (1·10⁴ Pa) pressure the diameter is in the range of 0.1-10 mm, as non-limiting examples.

The symmetry axis of the hollow cathode cylinder is normal to the target ablation area 116, and the ratio of target surface—hollow cathode distance to the hollow cathode diameter is in the range of 0.1-10, preferably close to 1.

The insulating ring 103 is connected to the hollow cathode 101. The insulating ring 103 is comprised of any dielectric material having melting temperature >300° C., preferably aluminum oxide or other ceramic or plastic material. The insulating ring 103 is attached to the hollow cathode in any known way to prevent gas flow through the connection and fixed positioning on the hollow cathode 101.

The hollow cap electrode 105 is connected to the insulating ring 103. The hollow cap electrode 105 is attached to the insulating ring 103 in any known way to prevent gas flow through the connection and fixed positioning on the hollow cathode 101. The hollow cap electrode 105 is comprised of any known material having electrical conductivity >1·10³ S/m and melting temperature >300° C., preferably stainless steel, tungsten, copper, bronze or other metal alloy.

Also, to the hollow cap electrode 105 is connected a gas conduit tube 107. The gas conduit tube 107 is attached to the hollow cap electrode 105 in any known way to prevent gas flow through the connection and fixed positioning on the hollow cap electrode 105.

The hollow cap electrode shape, as shown in the FIG. 1, together with hollow cathode 101 and insulating ring 103 form a gas container 127. In more detail, the gas supplied by the gas conduit 107 enters the gas container and then through a slit 129 flows into the internal volume of hollow cathode in the vicinity of target 115. The gap defined by slit 129 should be less than or equal to half the difference between radius of the hollow cap electrode 105 and the radius of the hollow cathode 101. This in turn is equal to the radial dimension of the insulating ring 103—i.e. its width. The slit width determines the gas flux passing through it and hence the pressure difference of the gas inside the gas container 127 and in the process chamber 131. The slit width can be regulated in the range of 0.1-10 mm to achieve the pressure in the gas container at least twice higher than inside the chamber 131 due to the constant pumping of the process chamber.

The gas conduit 107, a gas flow restrictor 109, a vacuum feedthrough 113, and a support element 111 combined together form the feeding and supporting group 5. The feeding and supporting group 5 serves as support and suppliers of gas and electrical power for the Virtual Cathode group 3.

The gas conduit 107 is a tube with internal diameter of 1-10 mm as a non-limiting example. The gas conduit 107 is comprised of any known material having electrical conductivity >1·10³ S/m and melting temperature >300° C., preferably stainless steel, tungsten, copper, bronze or other metal alloy.

Also, the gas conduit 107 serves as an electrical conductor to provide the electrical connection between an electrical trigger unit 121 and hollow cap electrode 105.

More in detail, the electrical trigger unit generates, with any known method, a high voltage (from 1 to 60 kV as a non-limiting example) electrical pulse with a current in the range 0.01 kA to 1 kA, which delivered to the gas conduit end outside the process chamber with electrical cable. The gas conduit 107 conducts the electrical pulse to the hollow cap electrode 105 through an insulating vacuum feedthrough 113.

The gas conduit 107 connects the hollow cap electrode 105 with the vacuum feedthrough 113. More in detail, as shown in FIG. 1, gas conduit 107 has its distal end partially inserted inside the internal cavity of the hollow cap electrode 105, in such a way that the gas conduit 107 communicates with the internal cavity of the gas container 127.

The vacuum feedthrough 113 comprised of any known dielectric material having melting temperature >300° C. preferably aluminum oxide or any other known ceramic or plastic material, for example Teflon as a non-limiting example. The vacuum feedthrough 113 provides vacuum tighten connection in any known way to the gas conduit 107 in such a way that the internal volume of vacuum chamber and the internal volume of gas conduit do not communicate with the atmosphere outside the processing chamber 131.

Also, the vacuum feedthrough 113 connected to a support element 111 in a way to provide vacuum tight connection (no gas flow through connection from outside the process chamber). The support element 111 is comprised of any known material having electrical conductivity >1·10³ S/m and melting temperature >300° C., preferably stainless steel, tungsten, copper, bronze or other metal alloy. The support element 111 serves as an electrical conductor to provide the electrical connection between an electrical pulsed power unit 119 and the hollow cathode 101.

More in detail, the electrical pulsed power unit 119 generates, with any known method, a high-voltage (from −60 kV to −1 kV as a non-limiting example) high-current (0.1-10 kA) electrical pulse which delivered to the support element 111 outside the process chamber end with electrical cable. The support element 111 conducts the electrical pulse to the hollow cathode 101 through an insulating vacuum feedthrough 113.

Outside the process chamber the gas conduit 107 is provided with a gas flow restrictor 109. The gas flow restrictor 109 connects to a gas feed assembly 123—not shown—providing the gas pressure higher or equal to atmospheric pressure. The gas could be, as a non-limiting example, oxygen, nitrogen, argon, helium, xenon, and others. The gas flow restrictor 109 provides the pressure difference of the gas. The gas pressure in the internal cavity of the gas conduit 107 is lower that atmospheric pressure ($10^{-5}$-100 mbar, as a non-limiting example).

Figure 2:
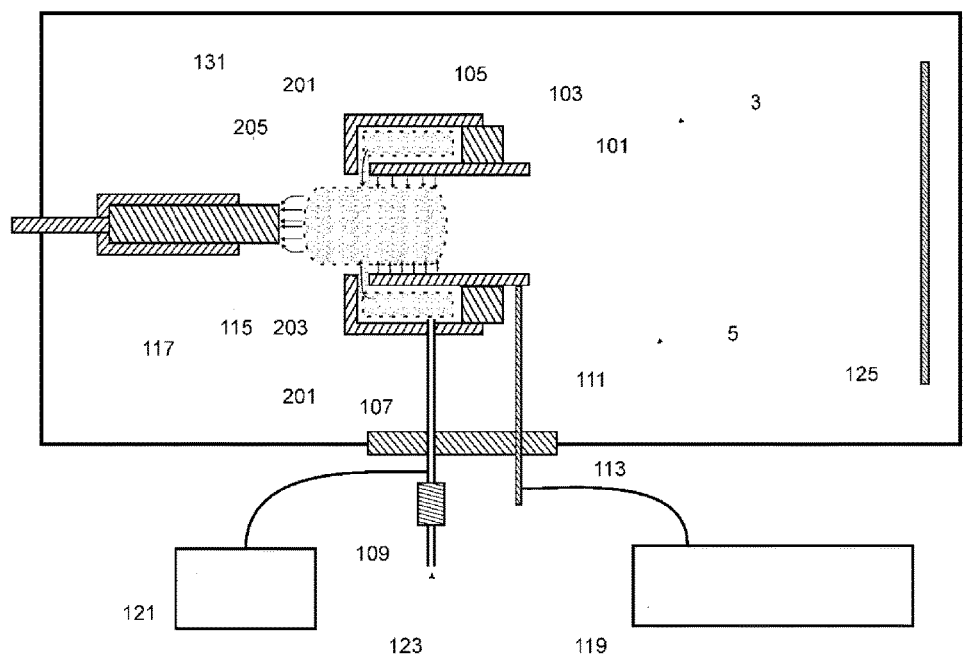
FIG. 2 illustrates initial plasma and virtual cathode plasma formation in the apparatus of FIG. 1.

The dynamics of the VCD operation will be now presented in conjugation with FIG. 2. Each pulse of VCD starts with activation of the pulsed power group. The pulsed power group 7 is wholly placed outside the process chamber 131 and comprises the electrical pulsed power unit 119 and the electrical trigger unit 121.

The pulsed power unit 119 comprises the bank of capacitors having a total capacitance of 1-60 nF as a non-limiting example. Also, pulsed power unit 119 comprises a high-voltage charger allowing it to charge the capacitors bank at a voltage in the range of –1 to –60 kV and an appropriate high voltage switch allowing fast delivery (<50 microseconds as a non-limiting example) of the electrical charges stored into capacitors through electrical cables to the external end of support element 111. The internal parts of the pulsed power group 7 are not shown and can be any known devices characterized in ability to produce electrical pulses of a 0.1-100 microsecond duration, in the voltage range of –1 kV to –60 kV, at repetition rate up to 20 kHz. In practice, for most materials a pulse voltage in the range –5 kV to –20 kV will be suitable.

The high voltage switch activation leads to triggering of an initial plasma supply operation by a negative potential biasing of the hollow cathode 101. At this moment, the hollow cap electrode 105 has a zero potential that leads to appearance of potential difference between hollow cathode and the hollow cap electrode. Optionally, the triggering of the initial plasma can be assisted by an electrical trigger unit. Namely, the potential difference can be additionally increased when the electrical trigger unit activates to enhance the initial plasma 201 formation. The electrical trigger unit 121 serves as provider of potential difference of 1-60 kV between the hollow cathode 101 and the hollow cap electrode 105 during the initial phase of the high voltage pulse formation by the pulse power unit 119. Namely, the hollow cathode 101 has rising negative potential while the hollow cap electrode has zero potential during the rise time of the pulse. Then, the electrical trigger unit can generate a short (<1 μs) positive pulse to provide positive bias of the hollow cap electrode 105 to increase the potential difference with respect to the hollow cathode 101. The potential difference combined with the higher pressure of the gas inside the gas container favors an initial plasma 201 formation. The electrical trigger unit 121 has exit capacitance of 1-10 nF that leads to the current pulse flow through the initial plasma 201 to equalize the potential difference.

In some pressure ranges a trigger pulse is not needed, and the main pulse voltage is enough to ignite the initial plasma.

In more detail, the pulsed power unit 119 provides a current flow from hollow cathode through the initial plasma 201 to the hollow cap electrode. This current flows toward the electrical trigger unit 121 to charge the entrance capacitance. When the entrance capacitance is charged the hollow cap electrode acquires the negative high voltage potential. This current pulse increases the initial plasma density—the bigger the exit capacitance of electrical trigger unit, the higher the charge that will be transferred through the initial plasma and hence the denser initial plasma. When the initial plasma 201 obtains density $\geq 10^{13}$ cm$^{-3}$, the potential difference between the hollow cathode and hollow cap electrode becomes <100 V due to the high conductivity of this initial plasma. The main pulse provides the energy required for plasma heating and ablation of the target.

This initial plasma 201 will expands from the gas container 127 through the gas slit 129 into the hollow cathode cavity and will form hollow cathode plasma 203. This hollow cathode plasma will have the potential of hollow cathode plus approximately 50 Volts due to the hollow cathode effect. With respect to the grounded target this plasma will have high negative potential, namely potential provided by the pulsed power group plus 50 Volts (from –0.95 to –59.95 kV depending on the pulsed power unit voltage). The hollow cathode plasma having high negative potential will act as virtual cathode emitting the electron beam toward the target. At this stage of VCD apparatus operation the pulsed power group delivers negative charges to the hollow cathode, the hollow cathode emits the electrons into the hollow cathode plasma 203. The hollow cathode plasma in its turn emits the electron beam toward the grounded target 115. The pulsed power unit provides the energy stored in the capacitance bank to electron beam.

The density of the virtual cathode plasma will increase with: the increase in the charge transferred through the plasma due to the ablation of target, ionization of residual gases, and due to a pinch effect. The pinch effect is the compression of the plasma by the magnetic field generated by the current passing through this plasma.

When the pulsed power unit capacitance bank is discharged—empty—the plasma comprised of the ablated target material will start to expand in explosive-like manner due to the plasma pressure which is not compensated by the magnetic field. At this moment the plasma density can be >$10^{15}$ cm$^{-3}$.

Figure 3:
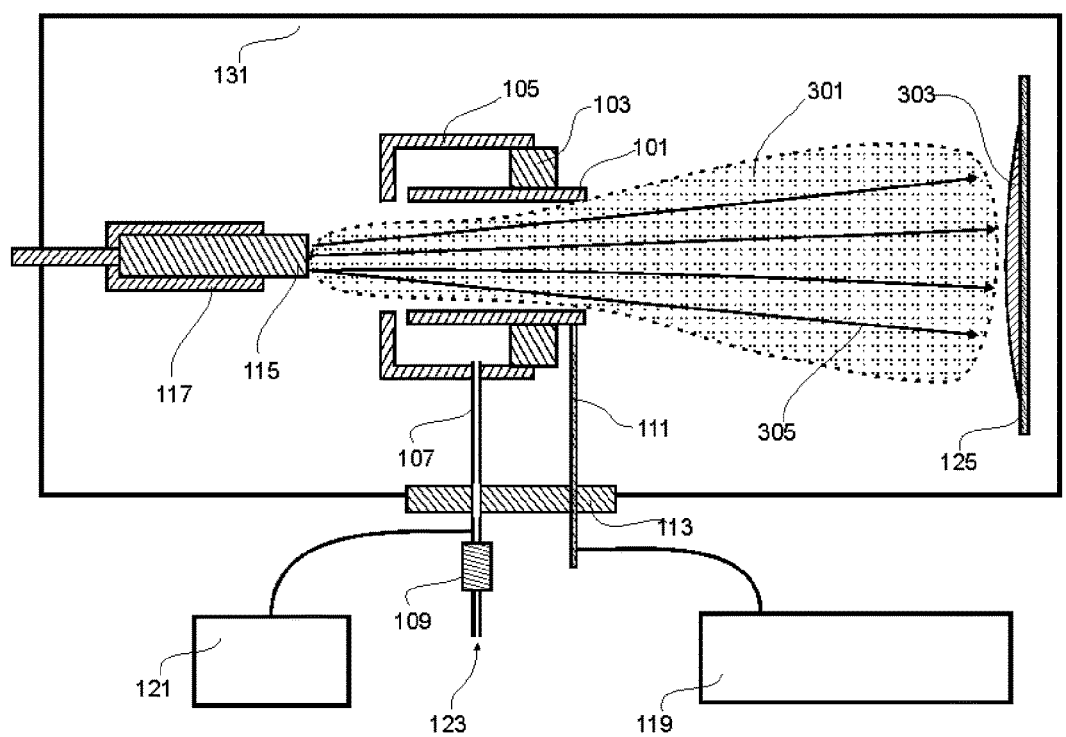
FIG. 3 illustrates plume plasma propagation features in the apparatus of FIG. 1.

The next stage of the VCD operation will be now presented in conjugation with FIG. 3. The pulsed power group 7 at this stage has finished the high voltage pulse generation and the hollow cathode 101 and the hollow cap electrodes have potential <1 kV in absolute value with respect to the ground potential of the process chamber 131.

The plasma comprising the target material chemical elements will propagates toward the substrate 125 with velocity $10^4$-$10^7$ cm/s along the axis of symmetry of virtual cathode group 3 and normal to the target ablation area 116. The propagation velocity will depend on the target material, power of the electrical pulse, and the pressure in the process chamber. Also this plasma will expand in the directions orthogonal to the axis of symmetry—radial expansion—due to the temperature expansion effect or ambipolar plasma diffusion effect.

Combined propagation and radial velocities will lead to plasma ions trajectories shown as arrows in FIG. 3. These ion trajectories lead to the plume-like shape of the plasma which is symmetrical with respect to the axis of symmetry of virtual cathode grope. When this plume plasma 305 arrives to the substrate 125 it will condense on the substrate surface as a thin film 303. The deposited thin film 303 will have thickness profile symmetrical to the axis of symmetry of the virtual cathode group. The deposited film will be thicker in the centre and thinner at the edges of the deposition spot. The deposited film composition comprises the target material elements. Also, the deposited film composition can comprise the chemical elements of the gas supplied by the gas feed assembly 123.

The deposited film crystal structure can be varied with the ionization state, kinetic energy, and flux density of the plume plasma 305 species that in its turn can be varied with the electrical pulse voltage, duration, current and the pressure of the gas in the process chamber.

Figure 4:
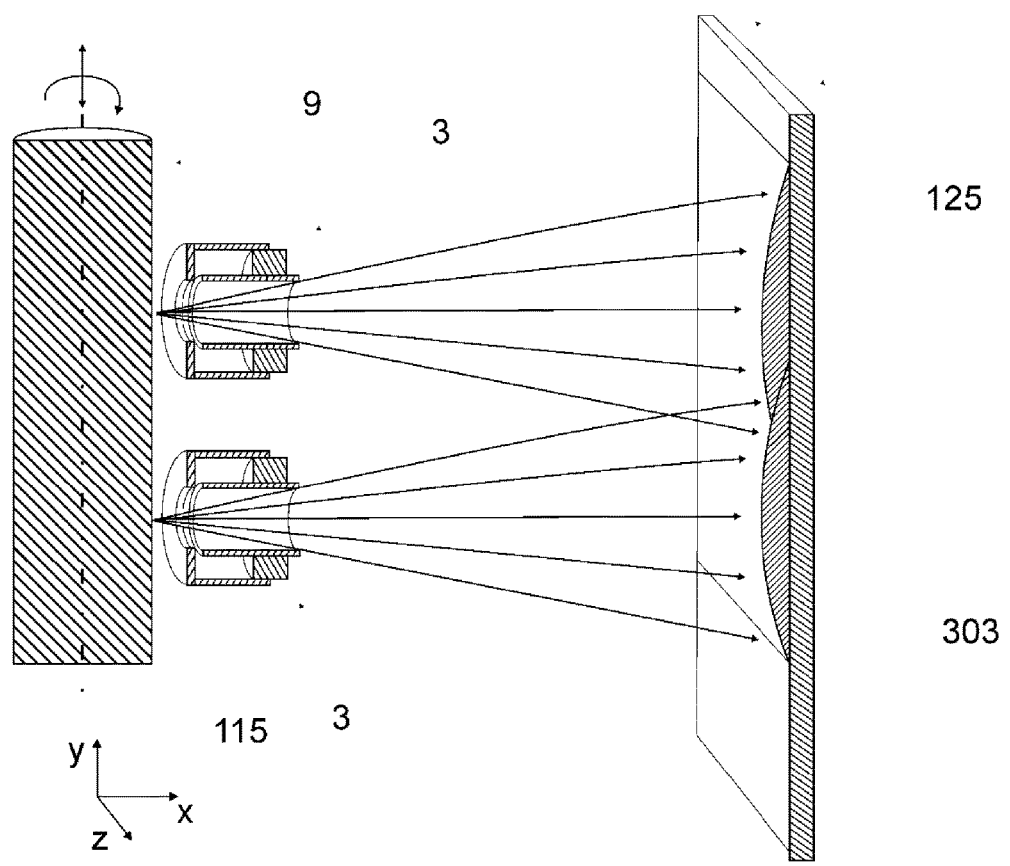
FIG. 4 shows an alternative apparatus for wide area deposition.

A wide area deposition apparatus based on two or more the VCD devises operation will be now presented in conjugation with FIG. 4. The wide area deposition apparatus further comprises more than one Virtual Cathode groups 3.

The wide area deposition apparatus further comprises a feeding and supporting and pulsed power group groups for each of the virtual cathode groups—not shown in FIG. 4. The virtual cathode groups can be positioned in a row along the y-direction and with the axis of symmetry parallel to each other—as a non-limiting example.

The wide area deposition apparatus further comprises a target 415. The target 415 can have a cylindrical shape, having a diameter which is larger than the diameter of the hollow cathode 101 and a length which is larger than the distance between axes of symmetry of two lateral virtual cathodes groups. Also, the target 415 can have any other known shape providing the target ablation areas 116 for all of the virtual cathodes groups 3 with the same positioning with respect to the corresponding cathodes group. Also, the target can be comprised of separate target groups similar to the described before and shown in FIG. 1 as the target group 9.

In the case of the cylindrical shape of the target 409, the target supporting system—not shown—of any known type can provide the rotation of the around the axis of symmetry combined with displacement in the y-direction of the FIG. 4 to provide the uniform consummation of the target 409 by all the virtual cathode groups during operation.

The wide area deposition apparatus further comprises the substrate 125. The substrate can have a form of a ribbon or a sheet that is long in they—direction, as non-limiting examples. The substrate can be provided with a movement system—not shown. The movement system can displace the substrate 125 in the y-direction.

The mutual positioning of the virtual plasma groups in a row of y-direction, cylindrical target having rotation and displacement in the y-direction, and the substrate parallel to the y-z plane defines the deposited film uniformity. More in detail, the plume plasmas provided by each of virtual cathode groups can merge and combine in a uniform plasma before arriving to the substrate. The deposited film of this plasma will have uniform thickness profile in y-direction at the substrate if the distance between the substrate and the target is greater than or equal to the distance between the axes of symmetry of the virtual cathodes group. The plasma plume radial expansion velocity is approximately equal to or less than its propagation velocity in the x-direction. The trajectories of the plume plasma species are shown in FIG. 4.

The constant speed movement of the substrate in z-direction will provide a homogenous film profile on the substrate in the z-direction, in combination with the constant repetition rate of the pulses provided by pulsed power groups to each of the virtual cathode groups.

Figure 5:
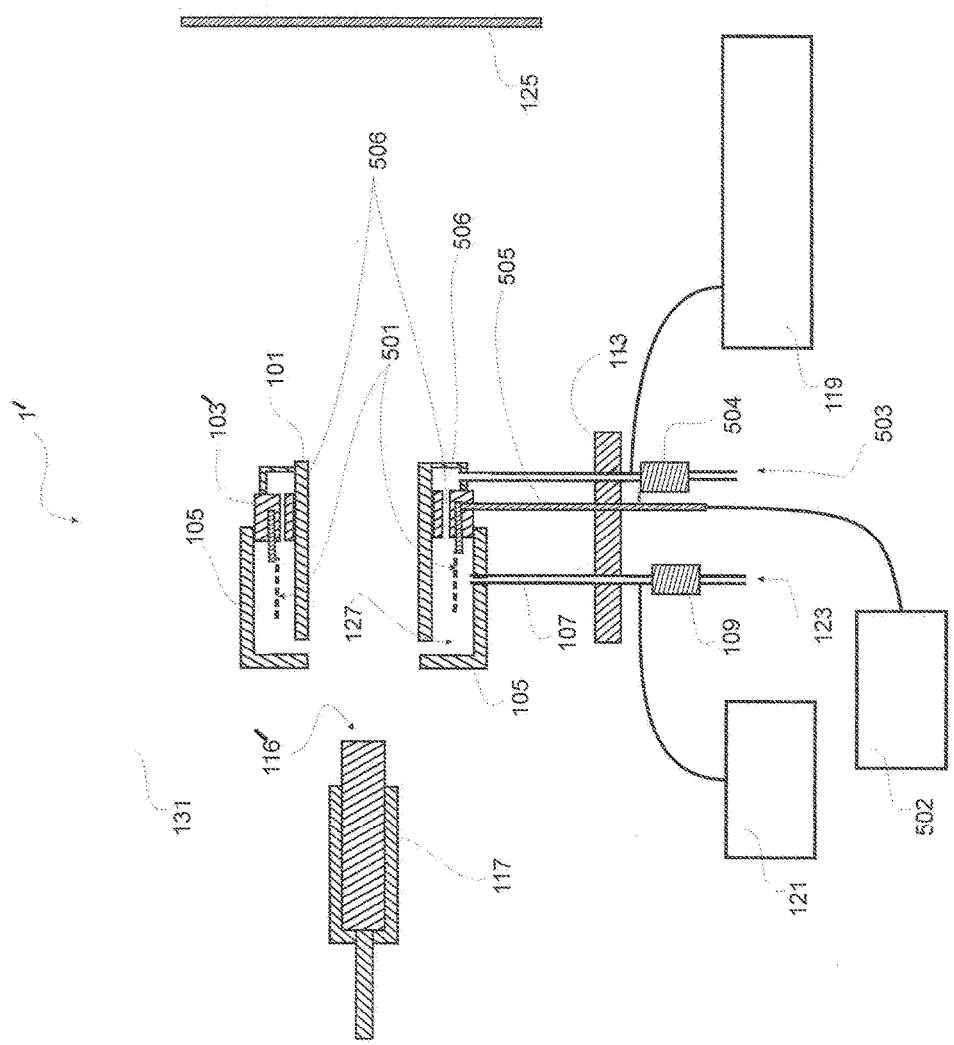
FIG. 5 shows a further alternative apparatus.

A further embodiment of a virtual cathode device is shown in FIG. 5. In some applications, in particular the deposition of diamond-like carbon ("DLC") films onto a substrate, a much higher electron beam energy density is required to ablate the target surface. In the example of DLC deposition, this is a graphite target.

Referring now to FIG. 5, the further embodiment is shown at 1'. In similar manner to the apparatus of FIG. 1, the apparatus 1' comprises a hollow cathode 101 and a hollow cap electrode 105. A gas conduit 107 supplies gas to chamber 127. The apparatus 1' further comprises a insulator 103' which defines an auxiliary gas chamber 506. Auxiliary gas chamber is connected to an addition gas supply 503 through a flow restrictor 504, allowing the rate of supply of gas to the auxiliary gas chamber 506 to be controlled. The auxiliary gas chamber 506 is connected to the gas chamber 127 by a plurality of apertures 507, and preferably at least three, to stimulate a uniform gas density in chamber 127. An additional electrode 501 is located within chamber 127, in this example comprising a generally cylindrical stainless steel grid. In this example a trigger pulse voltage of 3-30 kV with a rise time below 5 µs and total energy more than 0.1 J are be generated by the additional trigger pulsed power source 502. Those modifications allow the electron beam to be focused to a spot with a diameter of <1 mm at the graphite target surface. The pressure of the gas, preferably argon, in the chamber should be $<10^{-2}$ mb (1 Pa). The pulsed power unit 119 generates pulses of 10-20 kV with a total pulse energy of more than 2 J to ablate the graphite target and to provide the deposition of DLC film on substrate. The substrate can be any solid state material or device with a melting temperature above 40° C., comprising plastics, metals, ceramics, electronic and optical devices, or 3D printed parts as non-limiting examples.

In an example method, the apparatus 1' is provided with a graphite target 117' (99% purity), and a substrate 125, which may be glass, stainless steel, a golf ball, 3D printed parts, or any other suitable material. The chamber 127 is pumped down to $10^{-5}$ mbar ($10^{-3}$ Pa) initial pressure. Then argon gas is introduced from sources 123, 503 to increase the pressure in the chamber up to $3 \cdot 10^{-4}$-$1 \cdot 10^{-2}$ mbar ($3 \cdot 10^{-2}$-10 Pa), with the gas supply from source 503 providing 80%-100% of the gas flow. Pulsed power source 119 is operated to generate pulses of 10-30 kV voltage at 20 Hz-20 kHz repetition rate. When the pulse reaches its maximal voltage the trigger pulse is supplied by the trigger pulse generators 121, 502. The trigger pulse voltages are in the range of +5-+15 kV and have a duration in the range 100 ns-1 us, preferably 100 ns. A first trigger pulse is generated by trigger pulse generator 502 and a second pulse by trigger pulse generator 121, with a delay between the first and second pulses in the range 100-500 ns. The electrical pulses cause the formation of a virtual plasma cathode as in the example of FIG. 1, which in its turn generates an electron beam to ablate the target. The plume plasma then condenses on the substrate which is placed at 10-50 cm distance from the target. A DLC film is formed on the substrate with the rate of 10-1000 nm/min depending on the pulse repetition rate (linear dependence) and distance (inverse square dependence). The substrate temperature did not exceeded 40° C. for the pulse repetition rate of 200 Hz and 15 cm distance from the target. The DLC film obtained has a compact, partially amorphous partially crystalline structure with smooth surface (~100 nm rms) for films of 200 nm thickness. The target 117 can be rotated to utilise a larger fraction of the target surface during the operation. This enables a more uniform consumption of the target material.

A DLC film deposited with these parameters will have a variable sp3/sp2 ratio depending on the electron beam power density at the target surface. The hardness of the DLC film can be higher than 20 GPa, the surface is nano-crystalline and smooth with low friction coefficient. It can also be flexible and does not delaminate with bending—up to 2 mm radius—on a plastic (PET for example) substrate.

The applications of this type of DLC film may include protective or hard or bio-compatible coatings for optics, medical purposes, or sport equipment. The low friction coefficient can also decrease air friction over the surface, reducing the air friction loses of aircraft, cars, or golf balls as non-limiting examples. It was found a 10-20% increase in the average distance of golf ball flight was observed,if the ball was coated with DLC film by VCD method. Another example application for such DLC films application is providing a chemically protective layer, for example for ZnSe, where the DLC is transparent for infrared light and is resistant to most chemically active solvents, while also improving the scratch resistance of the ZnSe or other infrared optics. A DLC coating over 3D printed parts will improve the wear resistance of the parts and make them bio-compatible. Hence DLC-coated plastic parts can be used for medical applications such as implants, needles, catheters, or surgical instruments as non-limiting examples.

Further advantages of using VCD technology to deposition DLC films are the fast deposition rate of more than 100 nm/min, low temperature of deposition <60° C., low cost, variable hardness flexibility, smooth surface of the deposited film, and suitability for deposition on a wide range of substrates or devices without damaging them by thermal loading during deposition.

Other applications for the apparatus and method shown herein include the deposition of transparent conductive oxide ("TCO") films, such as $In_2O_3$, ZnO, ITO and any other suitable transparent doped semiconductor. In one example, an $In_2O_3$ film may be deposited using the apparatus of FIG. 1. The apparatus was provided with an $In_2O_3$ target (99.99% purity), and a substrate (glass, PET, etc.) placed at 10-50 cm distance from the target. The pressure in the chamber 137 is reduced to $10^{-5}$ mb ($10^{-3}$ Pa). Oxygen gas is then introduced through the gas source causing the pressure in the chamber to increase up to $3 \cdot 10^{-4}$-$8 \cdot 10^{-3}$ mb ($3 \cdot 10^{-2}$-08 Pa). The pulsed power source is operated to generate pulses of 10-30 kV voltage at 20 Hz-20 kHz repetition rate. When the pulse reaches its maximal voltage the trigger pulse is supplied by the trigger pulse generator. The electrical pulses cause to the formation of virtual plasma cathode which in its turn generates the electron beam ablating the target. The plume plasma then condenses on the substrate. The transparent conductive oxide, TCO, film forms on the substrate at the rate of 10-1000 nm/min depending on the pulse repetition rate (linear dependence) and distance (inverse square dependence). In a test the substrate temperature did not exceeded 60° C. for a pulse repetition rate of 200 Hz and 15 cm distance from the target (PET substrate was not damaged by the plume). The obtained TCO film has a compact columnar crystalline structure with a smooth surface (~10 nm rms) for films of 100 nm thickness. The 100 nm thick film can be deposited within 1 minute at 200 Hz pulse repetition rate. The film has better that 80% transparency in the visible region of the electro-magnetic spectrum, and its sheet resistance is less than 100 Ω/sq. The target can be rotated to so that the target material is uniformly exposed over a larger area of the target surface during the operation.

$In_2O_3$ films have a transparency >90% in visible region, and resistivity of 20 Ohm m with a thickness of >100 nm. A deposition rate higher then 100 nm/min was achieved. TCO deposition using the VCD apparatus is advantageous because of the low substrate temperature, high deposition rate, and the high quality of the TCO film without requiring post annealing, and it is scalable for industrial processes with low cost.

A further potential additional advantage of VCD for semiconductor film manufacturing is the possibility of doping the basic TCO material with precise control of doping distribution and amount, for example by adding the doping material into the target or introducing a second VCD source which in a pulsed mode will deposit the doping material from a separate target onto the same substrate during the deposition of the base material. In this way the doping material distribution within the basic material, energy of arriving doping species, density of the doping flux, and the relative amount of doping can be controlled by the separate control of the second VCD source frequency, energy of the pulse, voltage, focusing of the electron beam, and the delay with respect of the basic material depositing VCD pulse. This technique will enable development of new material compositions, such as, as a non-limiting example, p-doped ZnO with Li or N. The main problem of conventional deposition techniques is a low solubility of doping in the basic material which can be solved by forcing the doping species with high energy to be immersed into the base material by means of the second VCD source.

A further possible application is depositing lithium phosphorous oxy-nitride (LiPON) to form a solid state electrolyte for use in solid state batteries. Solid state batteries with LiPON have shown superior performance, but the industrial deposition process of LiPON made with RF sputtering has a very low deposition rate of a few nm/min that makes it expensive and commercially unsustainable. The low cost of deposition using a VCD technique and apparatus as described herein, combined with industrial scalability enables LiPON manufacture to be commercially sustainable. An advantage of VCD for LiPON deposition is the ability to transfer the complex composition of the target to the film necessary to obtain a high quality LiPON film having a high ion conductivity above $10^{-8}$ S/cm and lower electron conductivity.

In the above description, an embodiment is an example or implementation of the invention. The various appearances of "one embodiment", "an embodiment" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Furthermore, it is to be understood that the invention can be carried out or practiced in various ways and that the invention can be implemented in embodiments other than the ones outlined in the description above.

Meanings of technical and scientific terms used herein are to be commonly understood as by one of ordinary skill in the art to which the invention belongs, unless otherwise defined.

The invention claimed is:

1. A thin film deposition apparatus comprising;
   a hollow cathode, a substrate holder and a target holder, the substrate holder and the target holder being located on opposite sides of the hollow cathode,
   a plasma supply element to supply plasma to the interior of the hollow cathode at an end of the hollow cathode nearest the target holder, and
   a power unit connected to the hollow cathode to supply a high voltage pulse to the hollow cathode, such that when the plasma supply element supplies plasma to the hollow cathode and a high voltage pulse is applied to the hollow cathode, a virtual plasma cathode forms, and such that the virtual plasma cathode generates an electron beam, directed towards a target held in the target holder, and wherein a plume of ablated target material passes through the hollow cathode.

2. A thin film deposition apparatus according to claim 1 wherein the plasma supply element comprises a hollow cap electrode adjacent the hollow cathode and defining a gas container.

3. A thin film deposition apparatus according to claim 2 wherein the hollow cap electrode is spaced from the hollow cathode by an insulating ring and a gas flow slit extends from the gas container to the interior of the hollow cathode.

4. A thin film deposition apparatus according to claim 3 wherein the gas flow slit has a width in the range 0.1 mm to 10 mm.

5. A thin film deposition apparatus according to claim 1 wherein the plasma supply element comprises a hollow cap electrode adjacent the hollow cathode and defining a gas container and further comprises an electrical trigger unit connected to the hollow electrode to generate an initial plasma within the hollow electrode.

6. A thin film deposition apparatus according to claim 5 wherein the electrical trigger unit is operable to generate an electrical pulse with a voltage in the range 1kV to 60kV.

7. A thin film deposition apparatus according to claim 5 wherein the electrical trigger unit is operable to generate an electrical pulse with a current in the range 0.01 kA to 1 kA.

8. A thin film deposition apparatus according to claim 5 wherein the electrical trigger unit is operable to generate an electrical pulse with a duration of <1 µs.

9. A thin film deposition apparatus according to claim 2 comprising a gas conduit to supply gas to the gas container.

10. A thin film deposition apparatus according to claim 9 wherein the plasma supply element comprises an electrical trigger unit connected to the hollow electrode to generate an initial plasma within the hollow electrode, wherein the gas conduit is conductive and connects the trigger unit to the hollow cathode.

11. A thin film deposition apparatus according to claim 1 wherein the hollow cathode is substantially cylindrical.

12. A thin film deposition apparatus according to claim 11 wherein the cathode has a longitudinal axis, wherein the longitudinal axis is substantially normal to a surface of a target held in the target holder and to a surface of a substrate held in the substrate holder.

13. A thin film deposition apparatus according to claim 11 wherein the diameter of the hollow cathode is in the range 0.1 mm to 100 mm.

14. A thin film deposition apparatus according to claim 13 wherein the diameter of the hollow cathode is in the range 2 to 40mm.

15. A thin film deposition apparatus according to claim 13 wherein the diameter of the hollow cathode is in the range 0.1 mm to 2 mm.

16. A thin film deposition apparatus according to claim 11 wherein the hollow cathode has a diameter to length ratio in the range 0.1 to 10.

17. A thin film deposition apparatus according to claim 11 wherein the ratio of the distance between a surface of a target held in the target holder and the hollow cathode to the diameter of the hollow cathode is in the range 0.1 to 10.

18. A thin film deposition apparatus according to claim 1 wherein the power unit is operable to generate an electrical pulse with a voltage in the range −1 kV to −60 kV.

19. A thin film deposition apparatus according to claim 1 wherein the power unit is operable to generate an electrical pulse with a current in the range 0.1 kA to 10 kA.

20. A thin film deposition apparatus according to claim 18 wherein the power unit is operable to generate an electrical pulse with a duration in the range 0.1 µs to 100 µs.

21. A thin film deposition apparatus according to claim 1 comprising a process chamber containing the hollow cathode, substrate holder, target holder, and plasma supply element, and a pump element to maintain the pressure within the process chamber.

22. A thin film deposition apparatus according to claim 21 wherein the pressure within the process chamber is maintained in the range $10^{-3}$ Pa to 1 Pa.

23. A thin film deposition apparatus according to claim 1 further comprising a plurality of hollow cathodes.

24. A thin film deposition apparatus according claim 1 further comprising an auxiliary gas container, the gas container being connected to the gas container by a plurality of apertures.

25. A thin film deposition apparatus according to claim 24 further comprising an auxiliary trigger electrode located in the gas container.

26. A thin film deposition apparatus according to claim 25 further comprising an auxiliary trigger electrical trigger unit connected to the auxiliary trigger electrode.

27. A method of thin film deposition comprising;
providing a hollow cathode, a substrate and a target,
the substrate and the target being located on opposite sides of the hollow cathode,
supplying plasma to the interior of the hollow cathode at an end of the hollow cathode nearest the target, and
supplying a high voltage pulse to the hollow cathode,
such that a virtual plasma cathode is formed and
such that the virtual plasma cathode generates an electron beam, directed towards a target held in the target holder
wherein a plume of ablated target material passes through the hollow cathode towards the substrate.

28. A method according to claim 27 comprising supplying gas to a hollow cap electrode adjacent the hollow cathode and defining a gas container, and supplying an electrical trigger pulse to the hollow electrode to generate a plasma within the hollow cap electrode.

29. A method according to claim 28 wherein the electrical trigger pulse has a voltage in the range 1 kV to 60 kV and a current in the range 0.01 kA to 1 kA.

30. A method according to claim 28 wherein the electrical trigger pulse has a duration of <1 µs.

31. A method according to claim 27 comprising locating the target such that the ratio of the distance between a surface of the target and the hollow cathode to the diameter of the hollow cathode is in the range 0.1 to 10, and preferably is about 1.

32. A method according to claim 27, wherein the high voltage pulse has a voltage in the range −1 kV to −60 kV and preferably in the range −5 kV to −20 kV, and a current in the range 0.1 kA to 10 kA.

33. A method according to claim 27 wherein the high voltage pulse has a duration in the range 0.1 µs to 100 µs.

34. A method according to claim 27 where carried out using the apparatus of claim 1.

35. A thin film deposition apparatus according to claim 1, wherein the target serves as anode to the virtual plasma cathode when generating the electron beam.

36. A thin film deposition apparatus according to claim 1, wherein the virtual plasma cathode disappears after forming the electron beam, allowing the plume of ablated target material to pass through where the virtual plasma cathode was as it propagates towards the substrate holder.

\* \* \* \* \*